(12) United States Patent
Yin et al.

(10) Patent No.: US 11,539,906 B2
(45) Date of Patent: Dec. 27, 2022

(54) CMOS IMAGE SENSORS WITH INTEGRATED RRAM-BASED CROSSBAR ARRAY CIRCUITS

(71) Applicant: TETRAMEM INC., Newark, CA (US)

(72) Inventors: Wenbo Yin, Newark, CA (US); Ning Ge, Newark, CA (US)

(73) Assignee: TetraMem Inc., Fremont, CA (US)

(*) Notice: Subject to any disclaimer, the term of this patent is extended or adjusted under 35 U.S.C. 154(b) by 75 days.

(21) Appl. No.: 16/702,444

(22) Filed: Dec. 3, 2019

(65) Prior Publication Data

US 2021/0168321 A1    Jun. 3, 2021

(51) Int. Cl.
*H04N 5/3745*    (2011.01)
*G11C 13/00*    (2006.01)
*H04N 5/378*    (2011.01)

(52) U.S. Cl.
CPC ..... *H04N 5/37452* (2013.01); *G11C 13/0026* (2013.01); *G11C 13/0028* (2013.01); *G11C 13/0069* (2013.01); *H04N 5/378* (2013.01); *H04N 5/37457* (2013.01); *G11C 2213/70* (2013.01)

(58) Field of Classification Search
CPC ........ H04N 5/379; H04N 5/369; H04N 5/341; H04N 5/3745; H04N 5/378
See application file for complete search history.

(56) References Cited

U.S. PATENT DOCUMENTS

| | | | | |
|---|---|---|---|---|
| 6,473,122 | B1 * | 10/2002 | Kanekal | H04N 5/349 348/340 |
| 10,424,370 | B2 * | 9/2019 | Le Gallo-Bourdeau | H04N 5/335 |
| 10,440,341 | B1 * | 10/2019 | Luo | H04N 9/67 |
| 2003/0081134 | A1 * | 5/2003 | Luo | H04N 5/353 348/E3.018 |
| 2006/0278813 | A1 * | 12/2006 | Iesaka | H03F 3/08 250/214 A |
| 2010/0276572 | A1 * | 11/2010 | Iwabuchi | H01L 25/18 250/208.1 |
| 2014/0362270 | A1 * | 12/2014 | Hu | H04N 5/35554 348/308 |
| 2015/0381911 | A1 * | 12/2015 | Shen | H04N 5/3575 348/241 |
| 2018/0166495 | A1 * | 6/2018 | Ang | H01L 51/441 |

* cited by examiner

*Primary Examiner* — Twyler L Haskins
*Assistant Examiner* — Dwight Alex C Tejano
(74) *Attorney, Agent, or Firm* — Jaftery Watson Mendousa & Hamilton LLP (57) ABSTRACT

Technologies relating to CMOS image sensors with integrated Resistive Random-Access Memory (RRAMs) units that provide energy efficient analog storage, ultra-high speed analog storage, and in-memory computing functions are disclosed. An example CMOS image sensor with integrated RRAM crossbar array circuit includes a CMOS image sensor having multiple pixels configured to receive image signals; a column decoder configured to select the pixels in columns to read out; a row decoder configured to select the pixels in rows to read out; an amplifier configured to amplify first signals received from the CMOS image sensor; a multiplexer configured to sequentially or serially read out second signals received from the amplifier; and a first RRAM crossbar array circuit configured to store third signals received from the multiplexer.

15 Claims, 10 Drawing Sheets

CMOS IMAGE SENSORS WITH INTEGRATED RRAM-BASED CROSSBAR ARRAY CIRCUITS

TECHNICAL FIELD

The present disclosure relates generally to CMOS image sensors and more particularly to CMOS Image Sensors (CIS) with integrated Resistive Random-Access Memory units (RRAMs) that provide energy efficient analog storage, ultra-high speed analog storage, and in-memory computing functions for artificial intelligence (AI) and image processing capabilities.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

An RRAM is a two-terminal passive device capable of changing resistance responsive to sufficient electrical stimulations, which have attracted significant attention for high-performance non-volatile memory applications. The resistance of an RRAM may be electrically switched between two states: a High-Resistance State (HRS) and a Low-Resistance State (LRS). The switching event from an HRS to an LRS is often referred to as a "Set" or "On" switch; the switching systems from an LRS to an HRS is often referred to as a "Reset" or "Off" switching process. For computing applications, an RRAM may be placed in various multi-level conductance states to utilize the ohm's law for the computing.

Complementary Metal-Oxide-Semiconductor (CMOS) is a category of Metal-Oxide-Semiconductor Field-Effect Transistor (MOSFET) that uses complementary and symmetrical pairs of p-type and n-type MOSFETs for logic computations. CMOS technology may be used for constructing Integrated Circuits (ICs) including: microprocessors, microcontrollers, memory chips (including CMOS BIOS), and other digital logic circuits. CMOS technology may also be used in analog circuits as image sensors (CMOS image sensors), data converters, RF circuits (RF CMOS), and highly integrated transceivers for many types of communications. An image sensor converts light signals to electrical signals through a Charge-Coupled Device (CCD) or CMOS sensor (CIS). A CIS may be implemented using the mono-chip technology (where image sensors and driver circuits are placed on the same silicon chip) or 2-layer (or 3 layer) stacked technology (where image sensors and drive circuits are on the separate silicon chips and integrated through a packaging process).

SUMMARY

Technologies relating to CMOS image sensors with integrated Resistive Random-Access Memory (RRAMs) units that provide energy efficient analog storage, ultra-high speed analog storage, and in-memory computing functions are disclosed.

An example apparatus, in some implementations, includes: a CMOS image sensor having multiple pixels configured to receive image signals; a column decoder configured to select the pixels in columns to read out; a row decoder configured to select the pixels in rows to read out; an amplifier configured to amplify first signals received from the CMOS image sensor; a multiplexer configured to sequentially or serially read out second signals received from the amplifier; and a first RRAM crossbar array circuit configured to store third signals received from the multiplexer.

In some implementations, the first RRAM crossbar array circuit includes one or more of row lines, one or more column lines, and one or more RRAM cells connected between row lines and column lines.

In some implementations, the RRAM cell includes a one-transistor-one-memristor (1T1R) RRAM cell.

In some implementations, the amplifier includes a last stage source follower amplifier.

In some implementations, the three-stage OpAmp amplifier includes a first stage input stage, a second stage gain stage, and a third stage source follower amplifier.

In some implementations, three-stage OpAmp may be simplified to two stage or less, depending on the driving capability and requirements. Alternatively, an OpAmp may also have more than three stages for additional driving capabilities or other considerations.

The apparatus, in some implementations, further includes: a control unit configured to split signals from the amplifier into a first group of bits and a second group of bits; and a second RRAM crossbar array circuit configured to store the third signals received from the multiplexer.

In some implementations, the first group of bits can be the most significant bits, and the second group of bits includes the remaining least significant bit.

In some implementations, neither the first RRAM crossbar array circuit or the second RRAM crossbar array circuit is capable of storing more than 6 bits, and the CMOS image sensor is capable of generating equal to or more than 10 bits.

In some implementations, the control unit is configured to split the signals from the multiplexer rather than the amplifier.

In some implementations, the CMOS image sensor includes a first number of pixels, the amplifier includes the first number of amplifiers, and the first RRAM crossbar array circuit includes the first number of RRAM cells.

The apparatus, in some implementations, further includes a trans-impedance amplifier configured to convert current signals from the first RRAM crossbar array circuit to voltage signals.

In some implementations, the first RRAM crossbar array circuit is under In Memory Computing (IMC) mode.

In some implementations, the first RRAM crossbar array circuit is configured to perform a vector-vector multiplication (VVM) or a vector-matrix multiplication (VMM).

In some implementations, the first RRAM crossbar array circuit is configured to be programmed and read.

An apparatus, in some implementations, includes: a CMOS image sensor having one or more pixels configured to receive image signals; and an IMC crossbar array circuit having IMC cells configured to store and process signals received from a multiplexer, wherein the IMC cells include a Metal-Insulator-Metal (MIM) structure and a transistor serially connected to the MIM structure.

In some implementations, the MIM structure includes an RRAM structure.

In some implementations, a ratio of a first number of the one or more pixels of the CMOS image sensor to a second number of the IMC cells in the IMC crossbar array circuit is 1:1 or N:1, where N is a positive integer.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to CMOS image sensors with integrated Resistive Random-Access Memory (RRAMs) units that provide energy efficient analog storage, ultra-high speed analog storage, and in-memory computing functions are disclosed. The technologies described in the present disclosure may provide the following technical advantages.

First, one or more CMOS sensors may be connected to a RRAM-based crossbar array circuit via an amplifier with high current driving capability. Because both a CMOS sensor and a RRAM-based crossbar array circuit may directly capture, process, and store analog signals, Analog-to-Digital Converter (ADC) becomes optional in the RRAM-based crossbar array circuit, saving more areas (e.g., space) and reducing power consumption. Due to its lower power consumption, the RRAM-based crossbar array circuit may function as a pre-digital processor, which may consistently be in an ON state and process all incoming data. A conventional image processing Digital Signal Processors (DSPs) consume much more power and thus are often kept in an OFF state for the majority of the time and activated only when a predefined event is triggered (for example, a pedestrian is detected in front of a car camera).

Second, a bit-splitting feature is provided to enable RRAM crossbar array circuits with limited storage capacities to process and to store large-scale image data produced by a CMOS image sensor, enabling the processing of high-resolution images. The bit-splitting feature is particularly useful in 3D imaging applications, Internet of Things (IoT) applications, AI vision applications, and any other applications that require large pixel sizes.

Third, image data may be read out in parallel (rather than only in series), resulting in faster image processing. Faster image process, in turn, reduces or eliminates image distortions caused by the Rolling Shutter effect.

Fourth, an RRAM crossbar array circuit may also be implemented for the purpose of providing In-Memory Computing (IMC). When an RRAM crossbar array circuit having an integrated CMOS image sensor operates in an IMC mode, pixel values presented in an analog form, e.g., as outputted from an amplifier, may be processed using the RRAM crossbar array circuit directly from the amplifier. These technologies enable edge computing operations in CMOS image sensor-based IoT applications. In these ways, traditional Analog-to-Digital Converters (ADCs) and Digital Signal Processors (DSPs) may become optional, which provides much faster response time for the RRAM-based crossbar array circuit, a critical technical advantage for latency-sensitive applications such as automatous driving vehicles.

Figure 1:
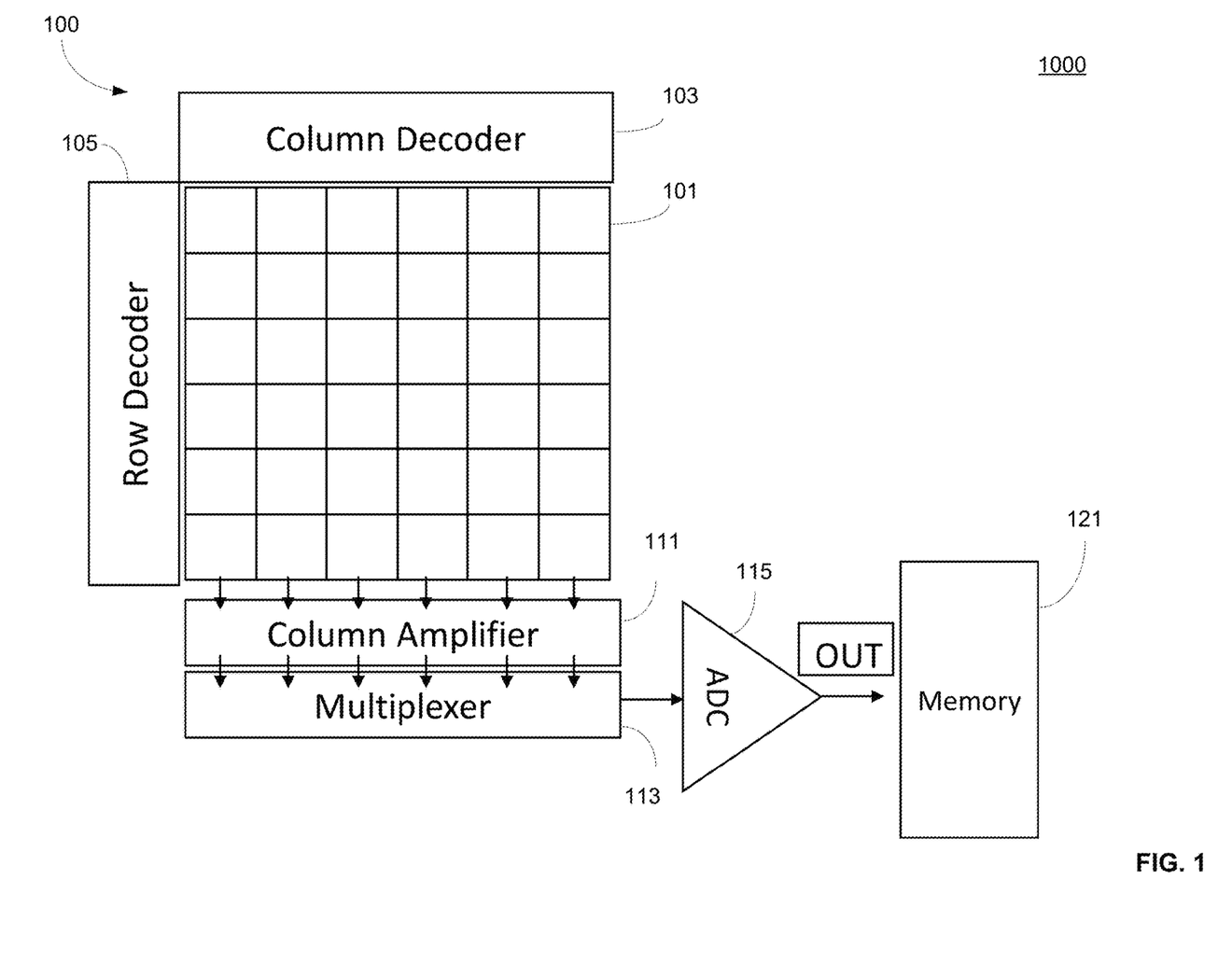
FIG. 1 is a block diagram illustrating an example CMOS image sensor-based circuit in accordance with some implementations of the present disclosure.

FIG. 1 is a block diagram 1000 illustrating an example CMOS image sensor-based circuit 100.

As shown in FIG. 1, the CMOS image sensor-based circuit 100 includes a CMOS image sensor 101 that includes multiple pixels (e.g., photo-sensitive pixels) configured to receive image signals, a column decoder 103 configured to select the pixels in columns to read out, a row decoder 105 configured to select the pixels in rows to read out, an amplifier 111 (e.g., a column amplifier) configured to amplify signals from the CMOS image sensor 101, a multiplexer 113 (e.g., a time-division multiplexer) configured to sequentially or serially readout signals from the amplifier 111, an Analog Digital Converter (ADC) 115 configured to convert analog signals received from the amplifier 111 from to digital signals, and a digital-based memory 121 configured to store digital signals provided by the ADC 115.

When light illuminates the CMOS image sensor 101, the CMOS image sensor collects signals from the selected rows and columns of the circuit 100. Signals (which may be in a voltage form) may then be amplified by the amplifier 111. Next, the multiplexer 113 read out signals sequentially or serially and send the signals to the ADC 115. The ADC 115 may convert the analog signals to corresponding digital signals, which may then be stored in the digital-based memory 121. The digital signals may be processed or accessed by a Central Processing Unit (CPU) or other processors.

1. Energy-Efficient CMOS Image Sensor with in-Memory Computing Crossbar

As explained above, an ADC may take up significant chip area and consumes significant power. In RRAM-based crossbar array circuits, however, the need for an ADC may be eliminated: RRAM-based crossbar array circuits are capable of directly processing and storing analog signals. Different implementations of RRAM-based crossbar array circuits with one or more integrated CMOS image sensors may provide different technical advantages.

Figure 2A:
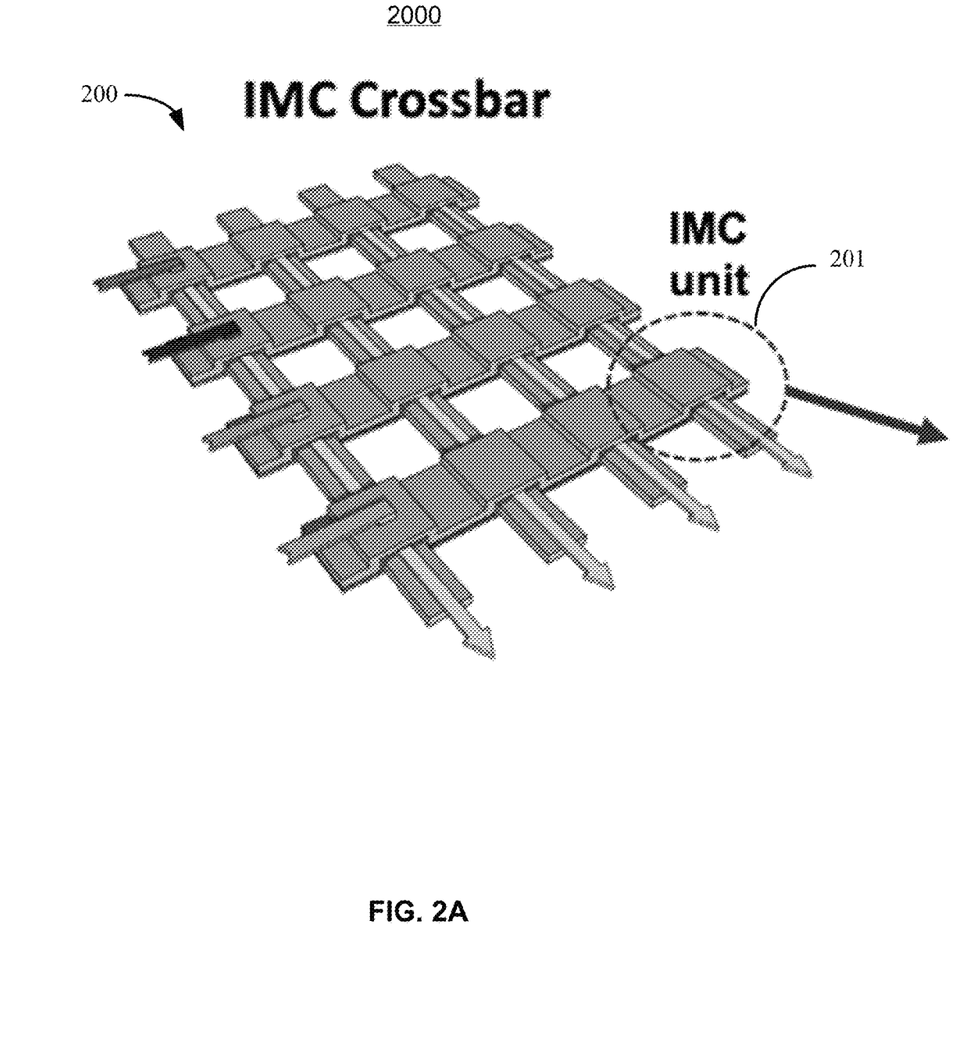
FIG. 2A is a block diagram illustrating an example In Memory Computing crossbar array circuit in accordance with some implementations of the present disclosure.

FIG. 2A is a block diagram 2000 illustrating an example IMC crossbar array circuit 200 in accordance with some implementations of the present disclosure. The CMOS image sensor circuit (which may be implemented with the circuit 100 shown in FIG. 1) may be integrated with the IMC crossbar array circuit 200 to realize the energy efficient CMOS image sensor with IMC crossbar array circuit. This integration accelerates the transmission of pixel data.

Figure 2B:
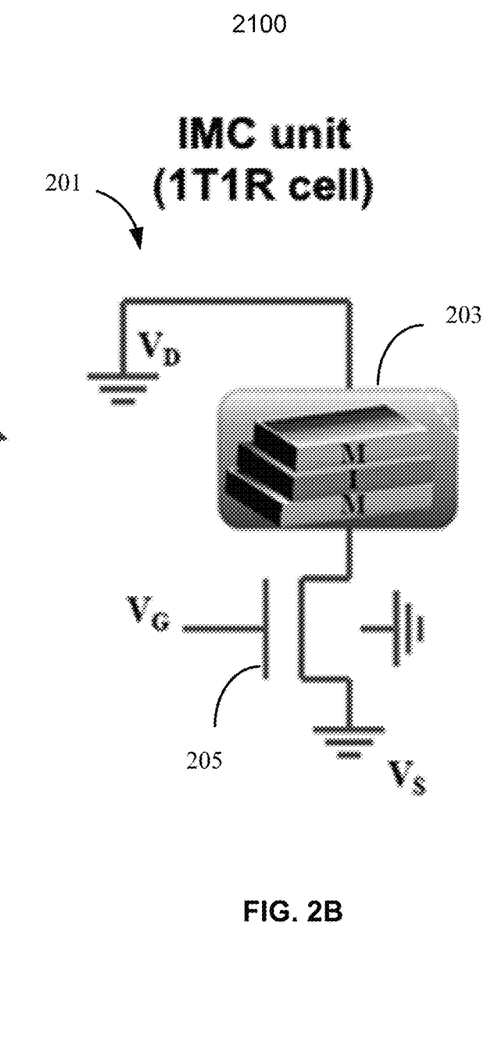
FIG. 2B is a block diagram illustrating an example In Memory Computing cell in accordance with some implementations of the present disclosure.

FIG. 2B is a block diagram 2100 illustrating an example IMC cell 201 in accordance with some implementations of the present disclosure. As shown in FIG. 2B, the IMC cell 201 includes a Metal-Insulator-Metal (MIM) structure 203 and a transistor 205 serially connected to the MIM structure 203. In some implementations, the MIM structure 203 includes an RRAM structure.

The ratio of a total number of pixels of the CMOS image sensor circuit to a total number of IMC cells in the IMC crossbar array circuit may be 1:1 or N:1 (where N is a positive integer). In some implementations, the ratio is 1:1, 2:1, 3:1, and 4:1.

2. Energy-Efficient CMOS Image Sensor with RRAM Analog Storage

In some implementations, a conventional amplifier is modified to provide with high current driving capability, because an RRAM's writing may require greater current.

In some implementations, because an RRAM-based crossbar array circuit may store only a limited number of bits (e.g., 6-8 bits), a control logic unit is provided to split data bits and store the split data bits in one or more different RRAM-based crossbar array circuits. This data bit splitting feature is particularly useful in the implementations where a higher resolution CMOS image sensor is used. A high-resolution CMOS image sensor often provides analog signals that have 10 or more bits.

Figure 3:
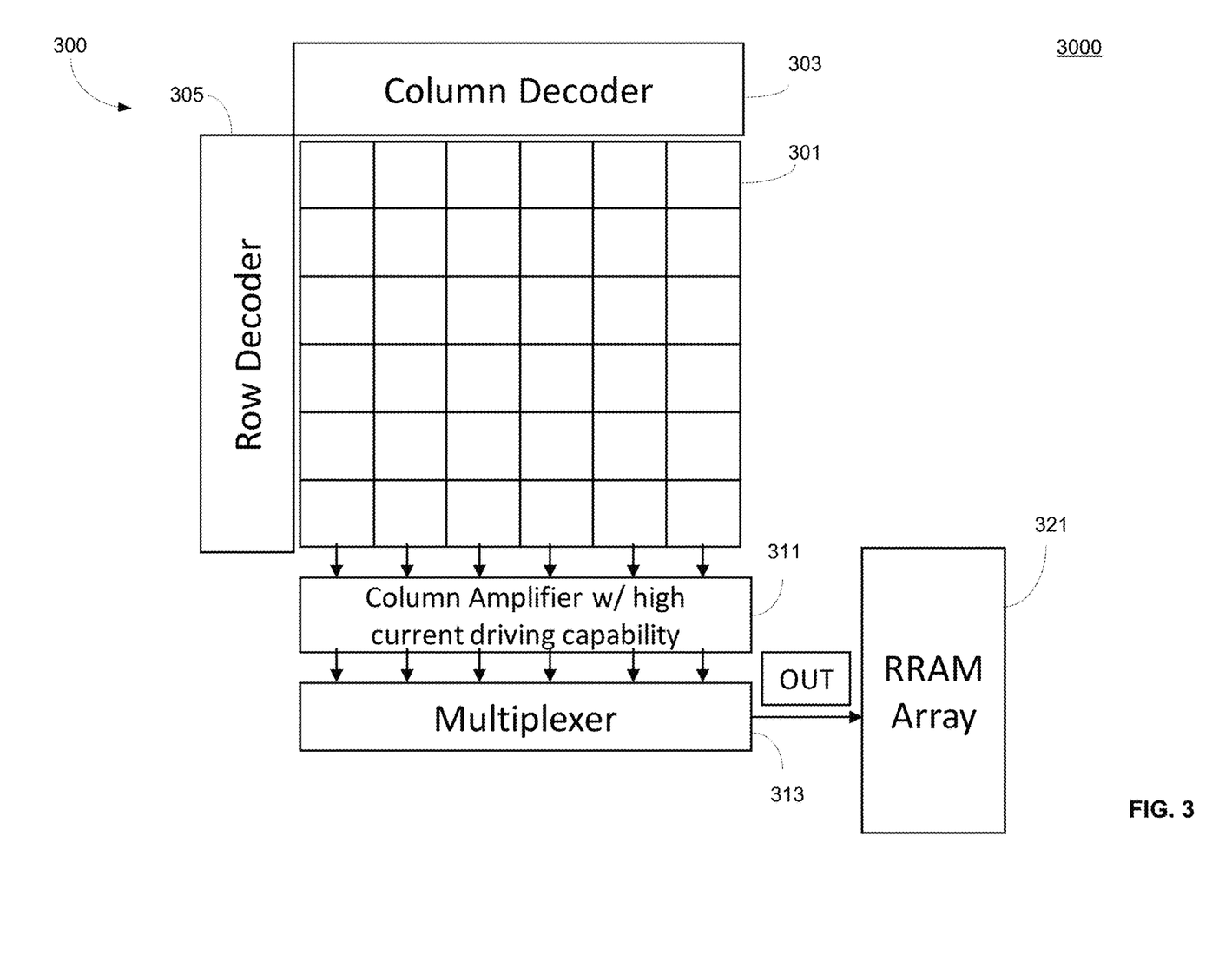
FIG. 3 is a block diagram illustrating an example CMOS image sensor-based and RRAM crossbar array-based circuit in accordance with some implementations of the present disclosure.

FIG. 3 is a block diagram 3000 illustrating a CMOS image sensor- and RRAM crossbar array-based circuit 300 in accordance with some implementations of the present disclosure.

As shown in FIG. 3, the CMOS image sensor- and RRAM crossbar array-based circuit 300 includes a CMOS image sensor 301 providing multiple pixels (e.g., photo-sensitive pixels), a column decoder 303 configured to read out pixels form one or more selected columns, a row decoder 305 configured to read out pixels form one or more selected rows, an amplifier 311 (e.g., a column amplifier) configured to amplify signals from the CMOS image sensor 301, a multiplexer 313 (e.g., a time-division multiplexer) configured to sequentially or serially readout signals from the amplifier 311, and an RRAM crossbar array circuit 321 configured to store the signals outputted from the multiplexer 313.

As shown in FIG. 3, the amplifier 311 is modified to connect the RRAM crossbar array circuit 321 with the CMOS image sensor 301. The amplifier 311 is configured to provide high current driving capacity to facilitate RRAM 321's data processing (e.g., writing).

Figure 4:
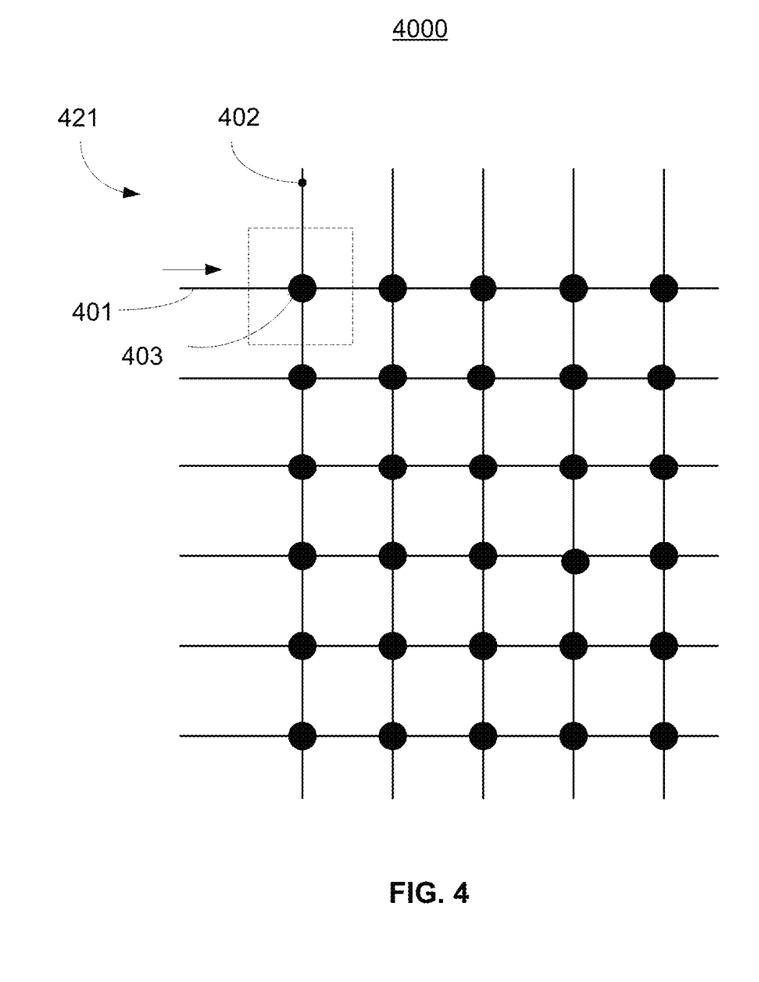
FIG. 4 is a block diagram illustrating an example RRAM crossbar array circuit in accordance with some implementations of the present disclosure.

FIG. 4 is a block diagram 4000 illustrating the RRAM crossbar array circuit 421 (which may be the same as the RRAM crossbar array circuit 321) in accordance with some implementations of the present disclosure. The RRAM crossbar array circuit 421 includes one or more of row lines (e.g., a first row line 401), one or more column lines (e.g., a first column line 402), and one or more RRAM cells (e.g., a first RRAM cell 403) connected between row lines and column lines. In some implementations, the RRAM cell 403 is a one-transistor-one-memristor (1T1R) RRAM cell.

Figure 5:
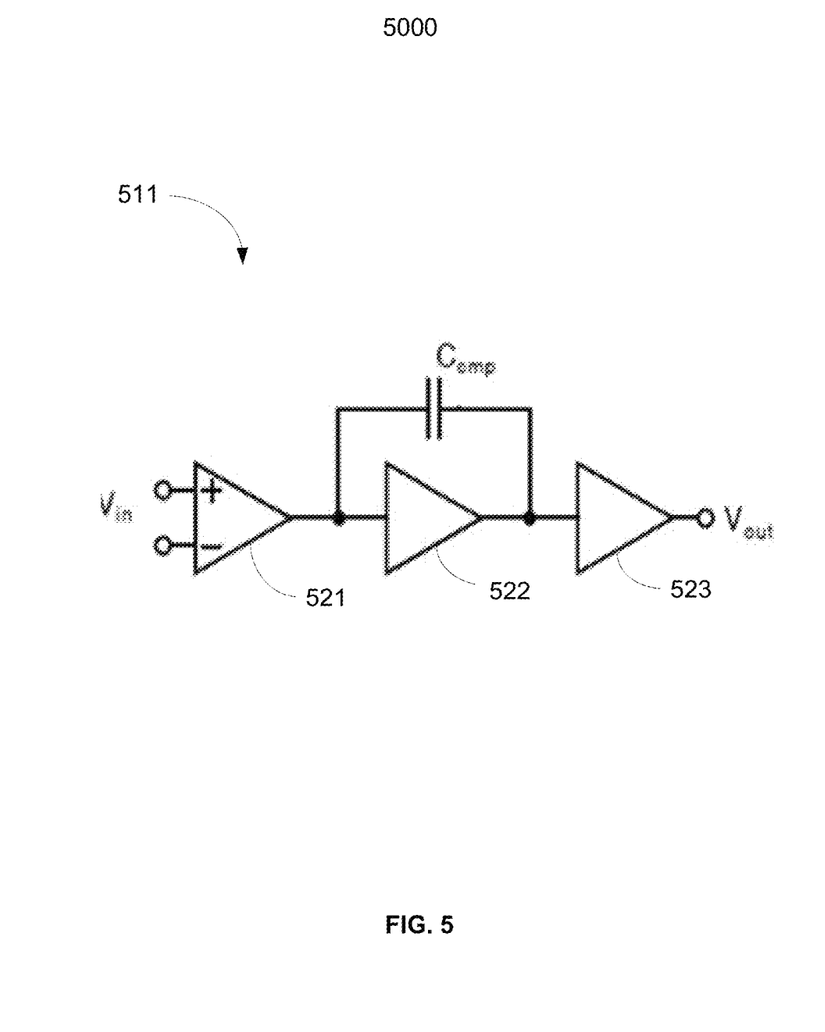
FIG. 5 is a block diagram illustrating an example amplifier with high current driving capabilities in accordance with some implementations of the present disclosure.

FIG. 5 is a block diagram 5000 illustrating an example amplifier with high current driving capabilities in accordance with some implementations of the present disclosure.

FIG. 5 shows one example three-stage operational amplifier 511. As shown in FIG. 5, the amplifier 511 includes a first stage (i.e., an input stage 521), a second stage (i.e., a gain stage 522), and a third stage (i.e., a source follower amplifier 523).

In some implementations, the third stage 523, which is also a source follower stage 523 includes a driver transistor and a load transistor.

Figure 6:
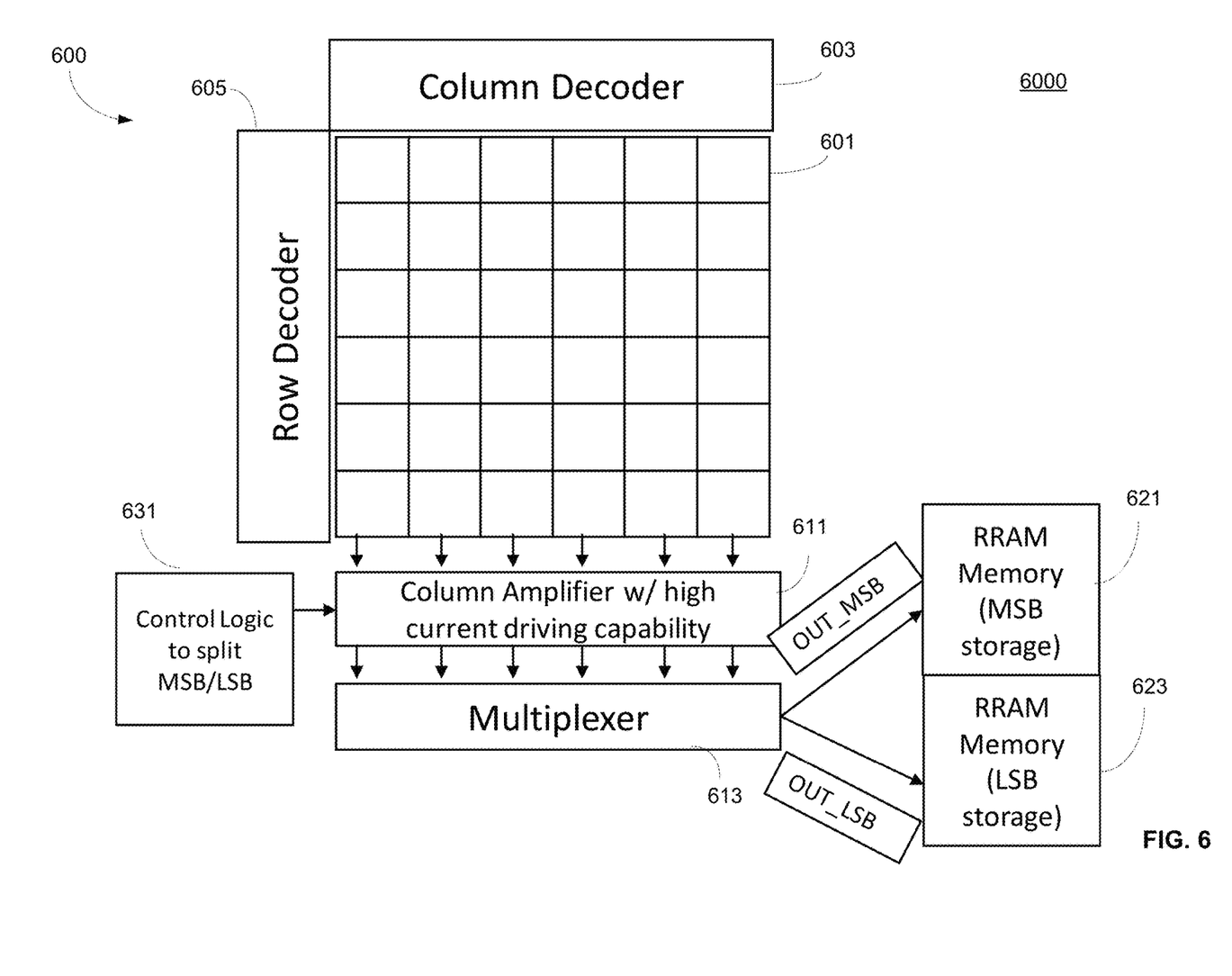
FIG. 6 is a block diagram illustrating an example CMOS image sensor- and RRAM crossbar array-based circuit in accordance with some implementations of the present disclosure.

FIG. 6 is a block diagram 6000 illustrating an example CMOS image sensor- and RRAM crossbar array-based circuit 600 in accordance with some implementations of the present disclosure.

As shown in FIG. 6, the CMOS image sensor- and RRAM crossbar array-based circuit 600 includes a CMOS image sensor 601 having multiple pixels (e.g., photo-sensitive pixels), a column decoder 603 that is configured to read out pixels from selected columns, a row decoder 605 that is configured to read out pixels from selected rows, an amplifier 611 (e.g., a column amplifier) that is configured to amplify signals outputted from the CMOS image sensor 601, a control logic unit 631 that is configured to split signals obtained from the amplifier 611 into a first group of bits and a second group of bits, a multiplexer 613 (e.g., a time-division multiplexer) that is configured to sequentially or serially read out the first group of bits and the second group of bits from the amplifier 611, a first RRAM crossbar array circuit 621 that is configured to store the first group of bits, and a second RRAM crossbar array circuit 623 that is configured to store the second group of bits.

In some implementations, the control logic unit 631 may split signals from the multiplexer 613 into two or more groups of bits (e.g., the first group of bits and the second group of bits).

In some implementations, neither the first RRAM crossbar array circuit 621 nor the second RRAM crossbar array circuit 623 is capable of storing more than 8 bits, while the CMOS image sensor 601 outputs signals that include 10 or more bits. In some implementations, more than two RRAM crossbar array circuits may be used to store the bits split from signals provided by the CMOS image sensor 601.

Furthermore, in some implementations, the first group of bits includes a Most Significant Bit (MSB), and the second group of bits includes a Least Significant Bit (LSB).

It is noted that the MSB (sometime also referred to as the high-order bit) is the bit position in a binary number having the greatest value. The MSB is sometimes referred to as the left-most bit due to the convention in positional notation of writing more significant digits further to the left.

The LSB (sometime also referred to as the low-order bit) is the bit position in a binary integer giving the units value, that is, determining whether the number is even or odd. The LSB is sometimes referred to as the right-most bit, due to the convention in positional notation of writing less significant digits further to the right.

Therefore, in some implementations, the first RRAM crossbar array circuit 621 is an MSB storage, while the second RRAM crossbar array circuit 623 is an LSB storage.

3. Ultra-High Speed CMOS Image Sensor with RRAM Analog Storage

As explained above, because an ADC consumes not only a large amount of chip area, but also a significant amount of power. As a result, only a handful of ADCs may be implemented on a chip. Further, due to the use of ADC, output from a pixel sensor may only be read out serially, not parallelly. Because the pixels are read out serially, different pixels may be read out at slightly different times. This distorts the output image, especially when the original image is moving (e.g., vertically or horizontally) at a rate similar to the speed at which the different rows or columns are read out. This is sometimes referred to as the Rolling Shutter effect.

Figure 7A:
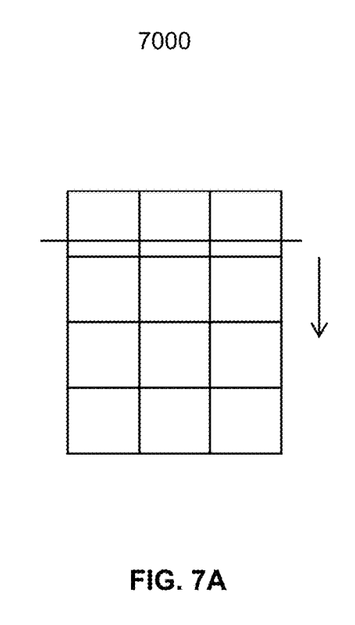
FIGS. 7A-7C are block diagrams illustrating example rolling shutter distortions of a CMOS image sensor.
Figure 7B:
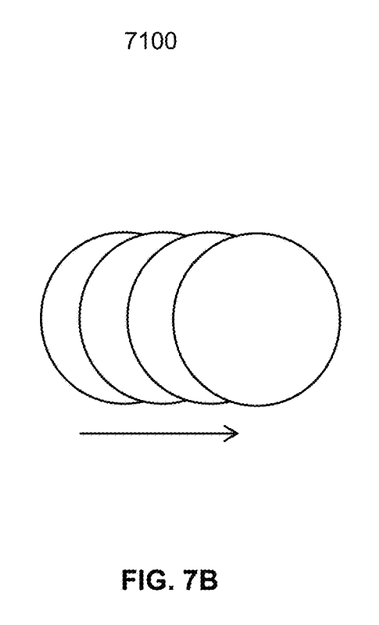
Figure 7C:
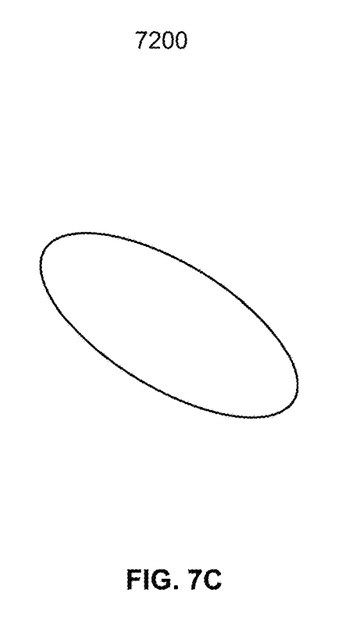

FIGS. 7A-7C are block diagrams 7000-7200 illustrating example rolling shutter distortions of a CMOS image sensor.

When a CMOS sensor chip is scanning down row-by-row (as shown in FIG. 7A), and a circular object is moving towards the right (as shown in FIG. 7B), the captured image of the circular object may appear as an eclipse (as shown on FIG. 7C). Such a distortion may occur, when the circular object moves at a speed similar to the readout speed of the CMOS image sensor.

To reduce rolling shutter effect, readout speed may be increased. A such, if ADC is removed, pixel data may be read out parallelly (rather than serially), resulting in greater readout speed and reducing rolling shutter distortion.

Figures 8A, 8B:
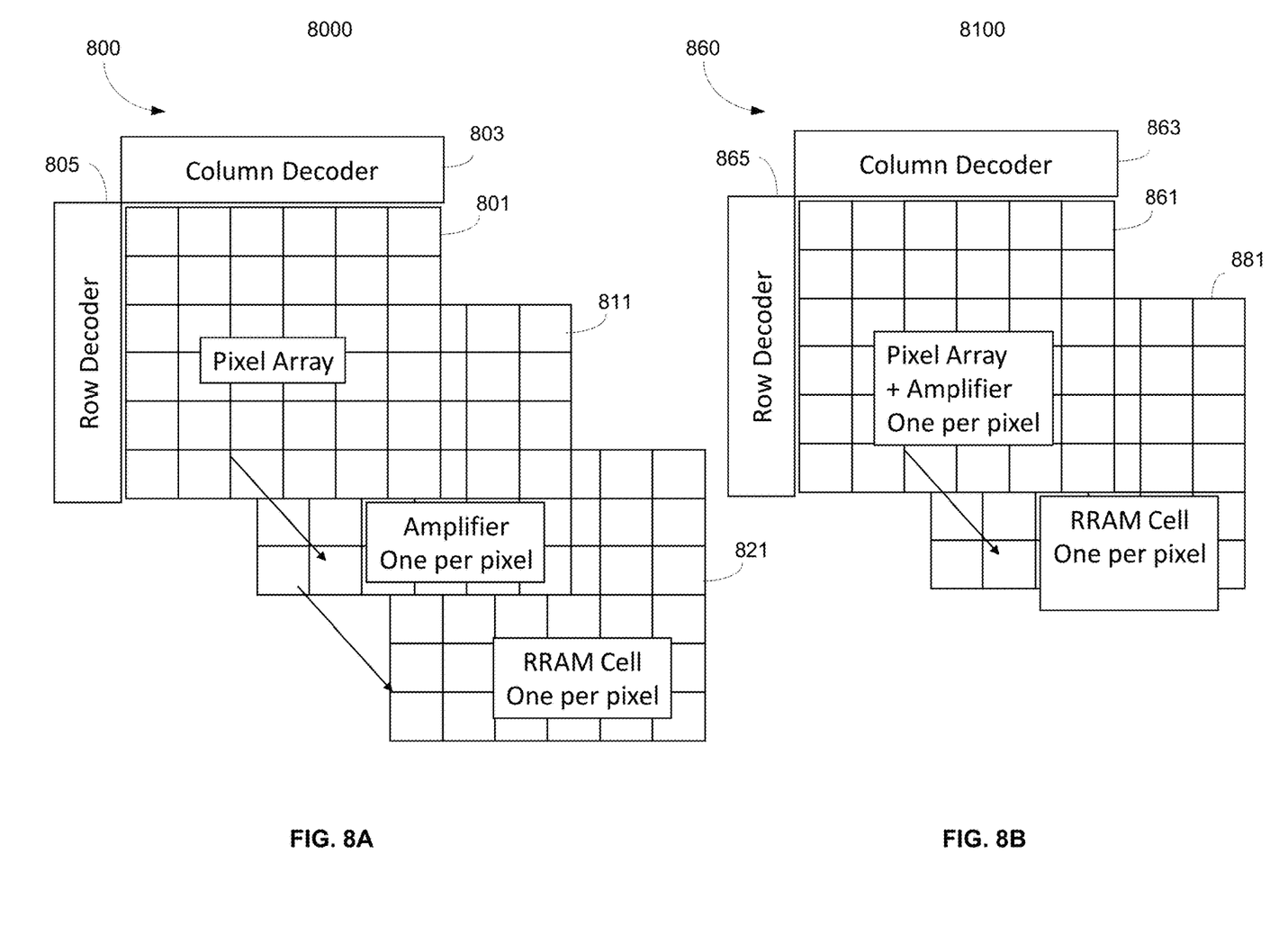
FIGS. 8A-8B are block diagrams illustrating example CMOS image sensor- and RRAM crossbar array-based circuits in accordance with some implementations of the present disclosure.

FIGS. 8A-8B are block diagrams 8000 and 8100 illustrating example CMOS image sensor- and RRAM crossbar array-based circuits 800 and 860 in accordance with some implementations of the present disclosure.

As shown in FIG. 8A, the CMOS image sensor-based and RRAM crossbar array-based circuit 800 includes a CMOS image sensor 801 having a first number of pixels (e.g., photo-sensitive pixel array), a column decoder 803 configured to read out pixels from selected columns, a row decoder 805 configured to read out pixels from selected rows, an amplifier array 811 having the first number of amplifiers configured to amplify signals from the CMOS image sensor 801, and a RRAM crossbar array circuit 821 having the first number of RRAM cells configured to store signals outputted by the amplifier array 811.

In some implementations, the CMOS image sensor 801 and the amplifier array 811 may be integrated together. As shown in FIG. 8B, for example, the circuit 860 includes an integrated unit 861, which includes a CMOS image sensor integrated into an amplifier circuit. The integrated unit 861 has a first number of pixels (e.g., a photo-sensitive pixel array) and an equal number of amplifiers.

As shown in FIG. 8B, the circuit 860 further includes a column decoder 863 configured to read out pixels from selected columns, a row decoder 865 configured to read out pixels from selected rows, and an RRAM crossbar array circuit 881 having the first number of RRAM cells configured to store signals outputted from the integrated unit 861.

4. CMOS Image Sensor with in-Memory Computing in RRAM

Besides providing data storage, an RRAM crossbar array circuit may also be implemented for in-memory computing. When an RRAM crossbar array circuit having an integrated CMOS image sensor operates an IMC mode, pixel values presented in an analog form, e.g., as outputted from an amplifier, may be processed using the RRAM crossbar array circuit directly from the amplifier. These technologies enable edge computing operations in CMOS image sensor-based IoT applications.

Many image processing algorithms may be divided into the form of Vector-Matrix Multiplication (VMM): Vout=Vin×G, where Vin and Vout represent the input image pixel data and output image pixel data, respectively, and G represents a matrix in which an image processing algorithm embodied.

Figure 9:
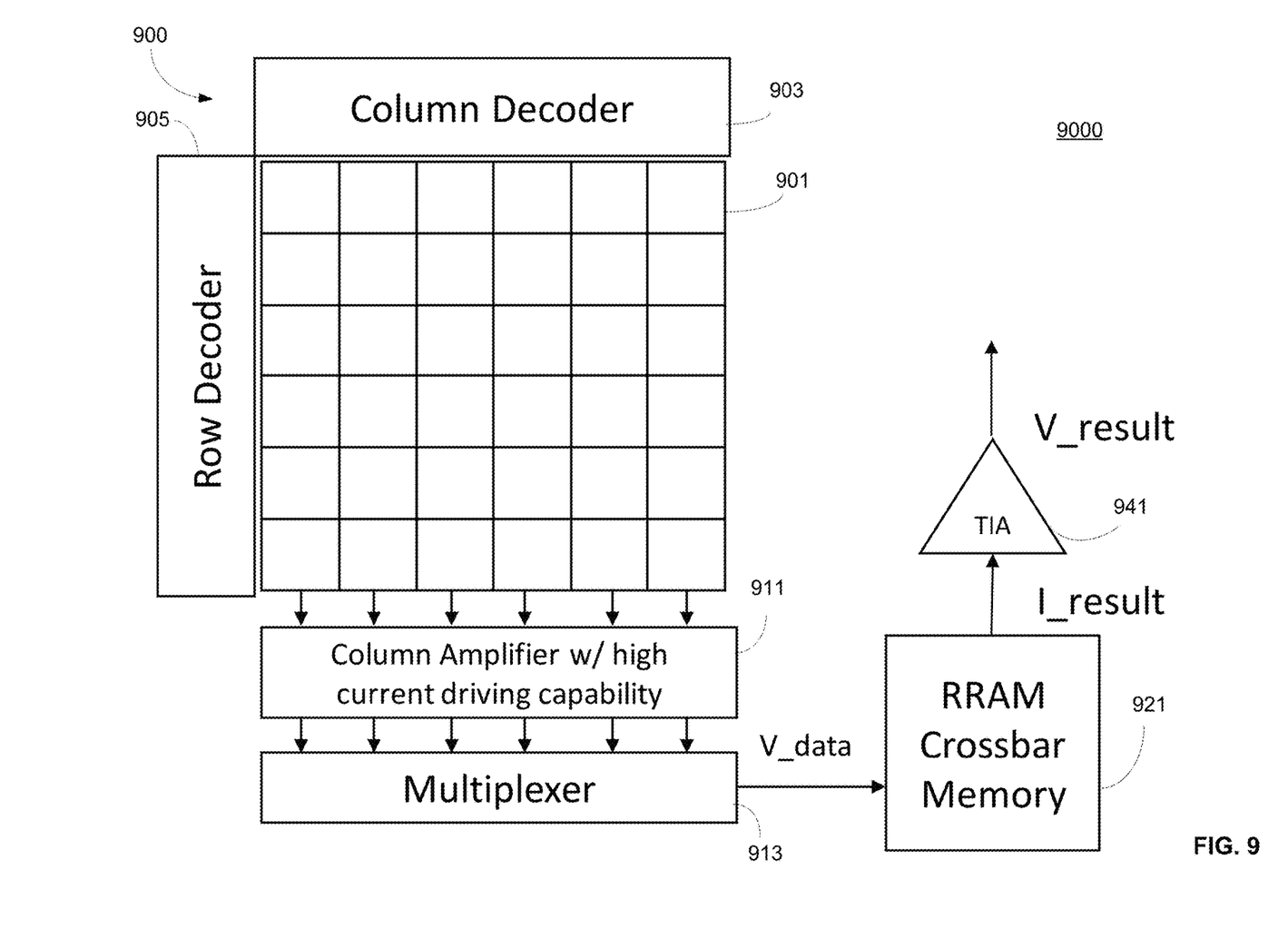
FIG. 9 is a block diagram illustrating an example CMOS image sensor- and RRAM crossbar array-based circuit in accordance with some implementations of the present disclosure.

FIG. 9 is a block diagram 9000 illustrating an example CMOS image sensor-based and RRAM crossbar array-based circuit 900 in accordance with some implementations of the present disclosure.

As shown in FIG. 9, the CMOS image sensor-based and RRAM crossbar array-based circuit 900 includes a CMOS image sensor 901 having multiple pixels (e.g., photo-sensitive pixels), a column decoder 903 configured to read out pixels from selected columns, a row decoder 905 configured to read out pixels from selected rows, an amplifier 911 (e.g., a column amplifier) configured to amplify signals outputted by the CMOS image sensor 901, a multiplexer 913 (e.g., a time-division multiplexer) configured to sequentially or serially readout signals from the amplifier 911, an RRAM crossbar array circuit 921 configured to store signals obtained from the multiplexer 913, and a Trans-Impedance Amplifier (TIA, e.g., a current-to-voltage converter) 941 configured to convert current signals obtained from the RRAM crossbar array circuit 921 to voltage signals.

In some implementations, the RRAM crossbar array circuit 921 is configured to operate in both a In Memory Computing (IMC) mode and a Memory mode. The circuit 921 may operate differently when in different modes. For example, when in the memory mode, only one word line in the circuit 921 is activated (switched ON) at once, all other word lines are closed (switched OFF). When in the IMC mode, multiple word lines in the circuit 921 may be activated at once.

Figure 10:
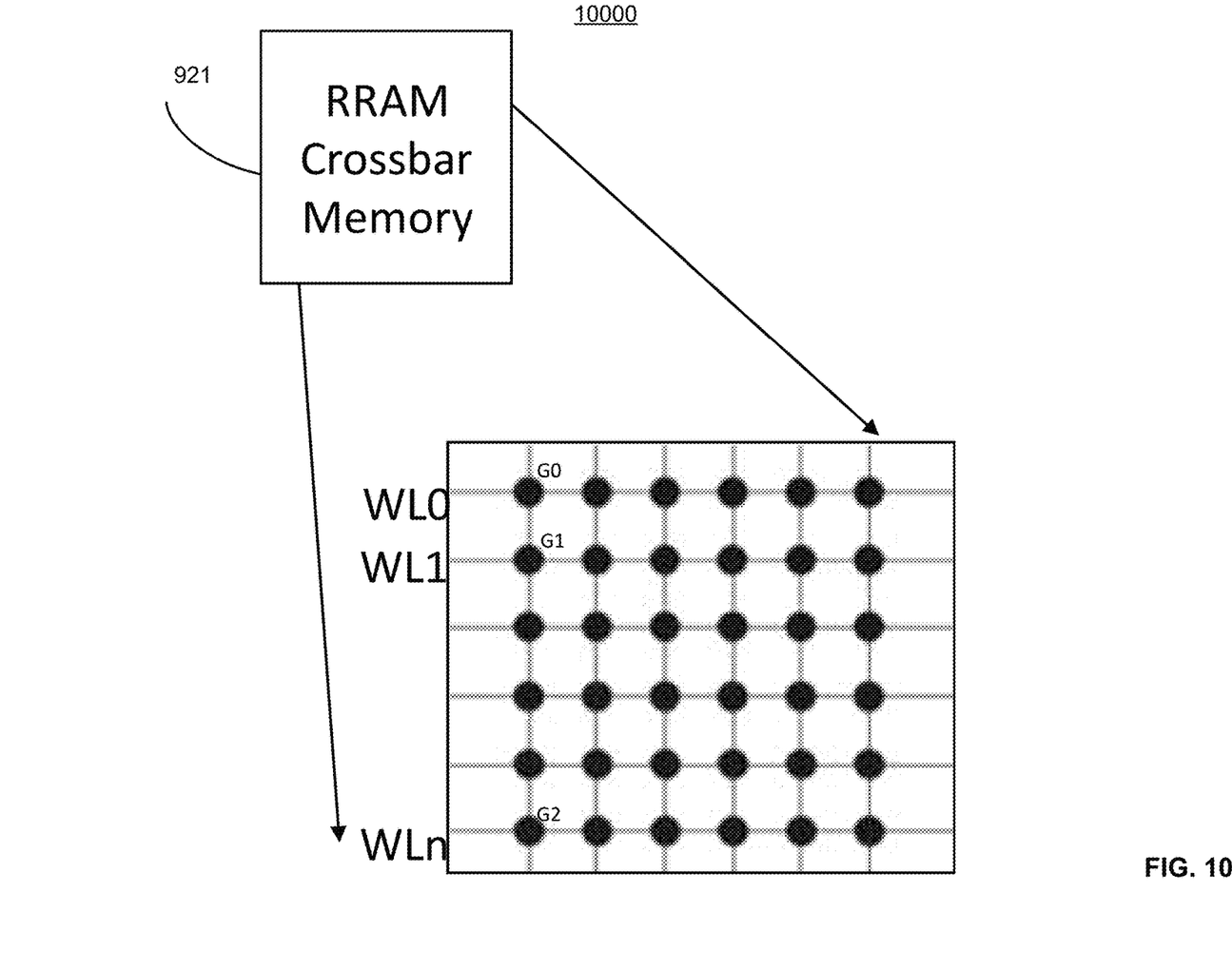
FIG. 10 is a block diagram 10000 illustrating a crossbar array circuit operating in an IMC mode in accordance with some implementations of the present disclosure.

FIG. 10 is a block diagram 10000 illustrating a crossbar array circuit operating in an IMC mode in accordance with some implementations of the present disclosure.

As shown in FIG. 10, all the word lines (WLs) may be activated, and the resulting current I is the dot product of the WL voltage vector and the RRAM cell conductance vector. The resulting current I may be calculated as follows:

$$I_1 = WL_0 \times G_0 + WL_1 \times G_1 + \ldots + WL_n \times G_n$$

In the IMC mode, a Vector-Vector Multiplication (VVM) or Vector-Matrix Multiplication (VMM) may be performed by the circuit 921. VVM or VMM may be computed as part of executing one or more machine learning algorithms. As shown, when the RRAM crossbar array circuit 921 operates in the IMC mode, the circuit 900 processes image signals received from the CMOS image sensor 901 in the IMC mode.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:
1. An apparatus comprising:
 a CMOS (complementary metal-oxide semiconductor) image sensor having multiple pixels configured to receive image signals;
 a column decoder configured to select the pixels in columns to read out;
 a row decoder configured to select the pixels in rows to read out;
 an amplifier configured to amplify first signals received from the CMOS image sensor;
 a multiplexer configured to sequentially or serially read out second signals received from the amplifier; and
 a first Resistive Random-Access Memory (RRAM) crossbar array circuit configured to store and process third signals received from the multiplexer, wherein the third signals are read out by the first RRAM crossbar array circuit from the multiplexer in parallel, and wherein the third signals correspond to pixel data generated by the CMOS image sensor.

2. The apparatus as claimed in claim 1, wherein the first RRAM crossbar array circuit comprises one or more of row lines, one or more column lines, and one or more RRAM cells connected between row lines and column lines.

3. The apparatus as claimed in claim 2, wherein the one or more RRAM cells comprise a one-transistor-one-memristor (1T1R) RRAM cell.

4. The apparatus as claimed in claim 1, wherein the amplifier comprises a three-stage operational amplifier.

5. The apparatus as claimed in claim 4, wherein the three-stage operational amplifier comprises a first stage comprising an input stage, a second stage comprising a gain stage, and a third stage comprising a source follower amplifier.

6. The apparatus as claimed in claim 5, wherein the source follower amplifier comprises a driver transistor and a load transistor.

7. The apparatus as claimed in claim 1, further comprises:
 a control unit configured to split signals from the amplifier into a first group of bits and a second group of bits, wherein the multiplexer is configured to read out the first group of bits and the second group of bis, wherein the first RRAM crossbar array circuit is configured to store and process the first group of bits received from the multiplexer; and
 a second RRAM crossbar array circuit configured to store the second group of bits received from the multiplexer.

8. The apparatus as claimed in claim 7, wherein the first group of bits comprises a most significant bit, and wherein the second group of bits comprises a least significant bit.

9. The apparatus as claimed in claim 7, wherein neither the first RRAM crossbar array circuit or the second RRAM crossbar array circuit is capable of storing more than 8 bits, and the CMOS image sensor is capable of generating equal to or more than 10 bits.

10. The apparatus as claimed in claim 1, further comprising a control unit configured to split the third signals from the multiplexer into a plurality of groups of bits, wherein the first RRAM crossbar array circuit is configured to store and process a group of bits of the plurality of groups of bits.

11. The apparatus as claimed in claim 1, wherein the CMOS image sensor comprises a first number of pixels, the amplifier comprises the first number of amplifiers, and the first RRAM crossbar array circuit comprises the first number of RRAM cells.

12. The apparatus as claimed in claim 1, further comprises a trans-impedance amplifier configured to convert current signals from the first RRAM crossbar array circuit to voltage signals.

13. An apparatus comprising:
 a complementary metal-oxide semiconductor (CMOS) image sensor having one or more pixels configured to receive image signals;
 a column decoder configured to select the pixels in columns to read out;
 a row decoder configured to select the pixels in rows to read out;

an amplifier configured to amplify first signals received from the CMOS image sensor;

a multiplexer configured to sequentially or serially read out second signals received from the amplifier; and an IMC (in-memory-computing) crossbar array circuit having one or more IMC cells configured to store and process third signals received from the multiplexer, wherein the one or more IMC cells include a Metal-Insulator-Metal (MIM) structure and a transistor serially connected to the MIM structure, and wherein the third signals are read out by the IMC crossbar array circuit from the multiplexer in parallel, and wherein the third signals correspond to pixel data generated by the CMOS image sensor.

14. The apparatus as claimed in claim 13, wherein the MIM structure comprises an RRAM (Resistive Random-Access Memory) structure.

15. The apparatus as claimed in claim 13, wherein a ratio of a first total number of the one or more pixels included in the CMOS image sensor to a second total number of the one or more IMC cells in the IMC crossbar array circuit comprises 1:1 or N:1, wherein N is a positive integer.

* * * * *